(12) United States Patent
Okuno et al.

(10) Patent No.: US 12,365,982 B2
(45) Date of Patent: Jul. 22, 2025

(54) PROCESSING APPARATUS AND EXHAUST SYSTEM

(71) Applicant: KOKUSAI ELECTRIC CORPORATION, Tokyo (JP)

(72) Inventors: Masanori Okuno, Toyama (JP); Toshihiko Yonejima, Toyama (JP); Masakazu Sakata, Toyama (JP); Masamichi Yachi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 16 days.

(21) Appl. No.: 17/000,518

(22) Filed: Aug. 24, 2020

(65) Prior Publication Data

US 2020/0392620 A1 Dec. 17, 2020

Related U.S. Application Data

(63) Continuation of application No. PCT/JP2019/008692, filed on Mar. 5, 2019.

(30) Foreign Application Priority Data

Mar. 6, 2018 (JP) ................................. 2018-040194

(51) Int. Cl.
*C23C 16/44* (2006.01)
*C23C 16/34* (2006.01)
(52) U.S. Cl.
CPC ........ *C23C 16/4412* (2013.01); *C23C 16/345* (2013.01)

(58) Field of Classification Search
None
See application file for complete search history.

(56) References Cited

U.S. PATENT DOCUMENTS 6,382,549 B1 * 5/2002 Krake .................... A45F 5/102
242/405.2
10,163,663 B2 * 12/2018 Yonejima .......... C23C 16/45565
(Continued)

FOREIGN PATENT DOCUMENTS

GB        2568359 A * 5/2019 ............. C23C 16/44
JP        07-240382 A     9/1995
(Continued)

OTHER PUBLICATIONS

Singapore Office Action issued on Mar. 23, 2021 for Singapore Patent Application No. 11202007978P.
(Continued)

*Primary Examiner* — Karla A Moore
(74) *Attorney, Agent, or Firm* — Volpe Koenig (57) ABSTRACT

According to one aspect of the technique, there is provided a processing apparatus including: a process structure including: a process furnace, in which an object to be processed is processed by a gas, provided in a housing; and an opening configured to enable a maintenance and provided at a rear side of the housing; an exhaust structure configured to allow a maintenance region to be provided at a region facing the opening and to exhaust the gas from the process furnace; and an exhaust apparatus configured to secure the maintenance region at the region facing the opening and placed in contact with a side of the exhaust structure opposite to the process structure.

8 Claims, 9 Drawing Sheets

(56) References Cited

U.S. PATENT DOCUMENTS

| | | | |
|---|---|---|---|
| 10,825,697 B2* | 11/2020 | Yamada | H01L 21/67017 |
| 11,450,536 B2* | 9/2022 | Kamimura | C23C 16/54 |
| 11,935,762 B2* | 3/2024 | Kamimura | H04W 72/0453 |
| 2009/0088001 A1* | 4/2009 | Nakagawa | C23C 16/45578 |
| | | | 257/E21.24 |
| 2010/0058984 A1* | 3/2010 | Marubayashi | C23C 16/24 |
| | | | 118/715 |
| 2012/0118229 A1* | 5/2012 | Shimada | C23C 16/455 |
| | | | 137/15.01 |
| 2013/0137279 A1* | 5/2013 | Yamamoto | H01L 28/40 |
| | | | 438/778 |
| 2015/0107515 A1* | 4/2015 | Shimada | C23C 16/458 |
| | | | 118/715 |
| 2018/0114953 A1* | 4/2018 | Sonoda | C23C 14/26 |
| 2018/0144953 A1* | 5/2018 | Yonejima | H01L 21/6719 |
| 2019/0198359 A1 | 6/2019 | Kamimura et al. | |
| 2024/0224238 A1* | 7/2024 | Kamimura | H04W 72/0453 |

FOREIGN PATENT DOCUMENTS

| | | | |
|---|---|---|---|
| JP | 2002170781 A | * | 6/2002 |
| JP | 2006-190812 A | | 7/2006 |
| JP | 2012-099763 A | | 5/2012 |
| JP | 2016-153620 A | | 8/2016 |
| KR | 10-2013-0060134 A | | 6/2013 |
| WO | 2018/003072 A1 | | 1/2018 |

OTHER PUBLICATIONS

Japanese Office Action issued on Jul. 5, 2021 for Japanese Patent Application No. 2020-505059.
Korean Office Action issued on Feb. 22, 2022 for Korean Patent Application No. 10-2020-7023789.
Chinese Office Action issued on Feb. 11, 2023 for Chinese Patent Application No. 201980013166.8.
Korean Office Action issued on Sep. 21, 2023 for Korean Patent Application No. 10-2023-7030295.

* cited by examiner

FIG. 9

PROCESSING APPARATUS AND EXHAUST SYSTEM

CROSS-REFERENCE TO RELATED PATENT APPLICATION

This non-provisional U.S. patent application claims priority under 35 U.S.C. § 119 of International Application No. PCT/JP2019/008692, filed on Mar. 5, 2019, in the WIPO, and Japanese Patent Application No. 2018-040194, filed on Mar. 6, 2018, in the Japanese Patent Office, the entire contents of which are hereby incorporated by reference.

BACKGROUND

1. Field

The present disclosure relates to a processing apparatus and an exhaust system.

2. Description of the Related Art

As a conventional processing apparatus, a processing apparatus in which an exhaust apparatus is installed on a lower floor (for example, a first floor) of a floor (for example, a third floor) where a process furnace is installed, or a processing apparatus in which the exhaust apparatus is installed on the same floor where the process furnace is installed may be used.

According to some related arts, the processing apparatus in which the exhaust apparatus is installed on the same floor where the process furnace is installed is disclosed. However, the exhaust apparatus is connected to a transfer chamber instead of the process furnace. Therefore, the process furnace communicates with the transfer chamber during a process to improve exhaust efficiency, which is not practical.

According to the processing apparatus in which the process furnace and the exhaust apparatus are installed on different floors, it is possible to place many process furnaces on the same floor. However, since the process furnace and the exhaust apparatus are connected by a long pipe, there is a problem that the conductance (exhaust efficiency) becomes small.

On the other hand, according to the processing apparatus in which the exhaust apparatus is installed on the same floor as the floor on which the process furnace is installed, an exhaust structure and the exhaust apparatus are placed on a side of the process furnace due to a layout of the processing apparatus. When the exhaust structure and the exhaust apparatus are arranged in the vicinity of the process furnace, a maintenance region may not be secured. Therefore, some measure may be needed to address the problem described above.

SUMMARY

Described herein is a technique capable of providing a configuration in which a maintenance region can be provided even when an exhaust apparatus is installed on the same floor as a floor on which a process furnace is installed.

According to one aspect of the technique of the present disclosure, there is provided a processing apparatus including: a process structure including: a process furnace, in which an object to be processed is processed by a gas, provided in a housing; and an opening configured to enable a maintenance and provided at a rear side of the housing; an exhaust structure configured to allow a maintenance region to be provided at a region facing the opening and to exhaust the gas from the process furnace; and an exhaust apparatus configured to secure the maintenance region at the region facing the opening and placed in contact with a side of the exhaust structure opposite to the process structure.

DETAILED DESCRIPTION

A configuration of a processing apparatus (also referred to as a "substrate processing apparatus") 10 according to an embodiment described herein will be described with reference to FIGS. 1 through 9. In the figures, a direction indicated by an arrow F represents a front direction of the processing apparatus 10, a direction indicated by an arrow B represents a rear direction of the processing apparatus 10, a direction indicated by an arrow R represents a right direction of the processing apparatus 10 (when viewed from a front of the processing apparatus 10), a direction indicated by an arrow L represents a left direction of the processing apparatus 10 (when viewed from the front of the processing apparatus 10), a direction indicated by an arrow U represents an upper direction of the processing apparatus 10, and a direction indicated by an arrow D represents a lower direction of the processing apparatus 10.

(1) Configuration of Processing Apparatus

Figure 1A:
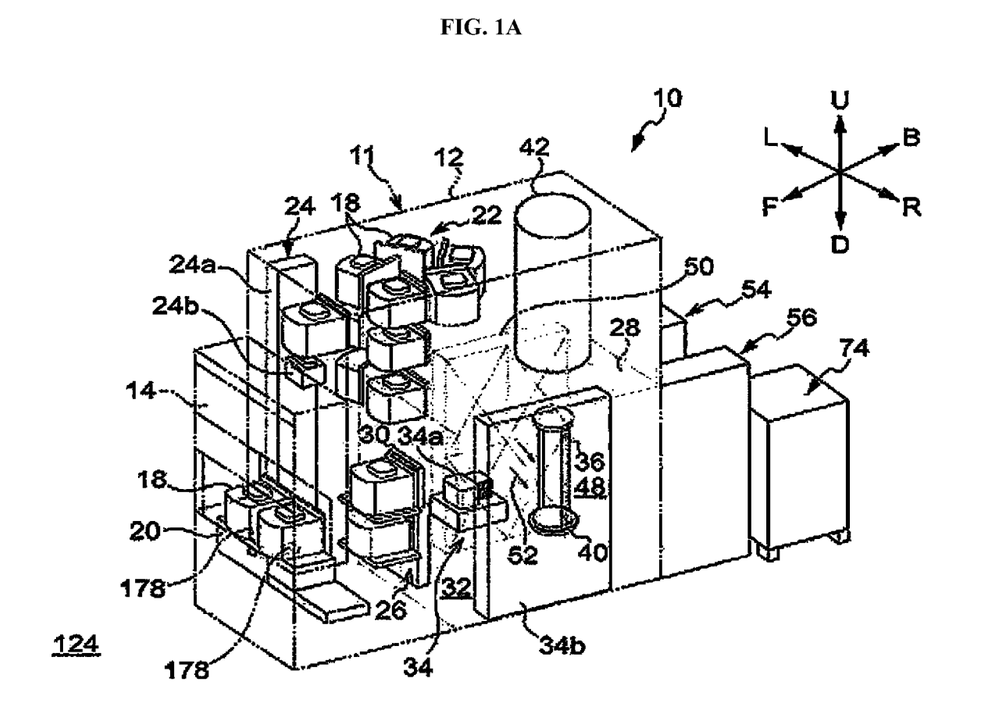
FIG. 1A is a perspective view schematically illustrating a processing apparatus according to an embodiment described herein.
Figure 1B:
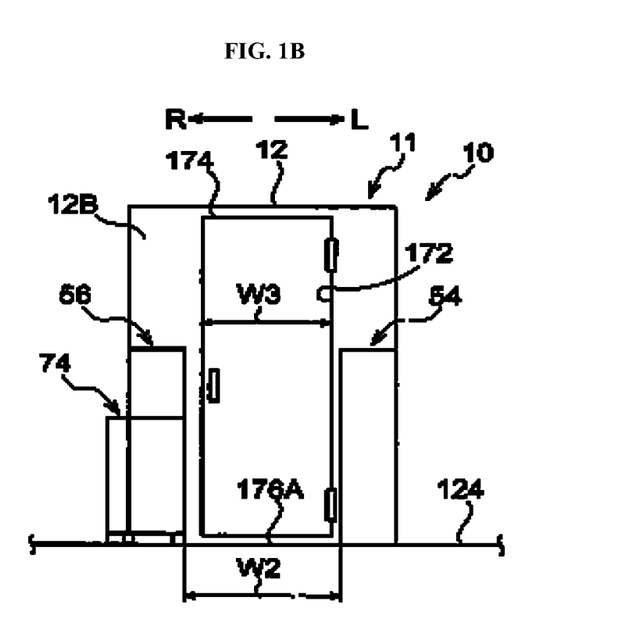
FIG. 1B is a rear view schematically illustrating the processing apparatus according to the embodiment described herein.
Figure 3A:
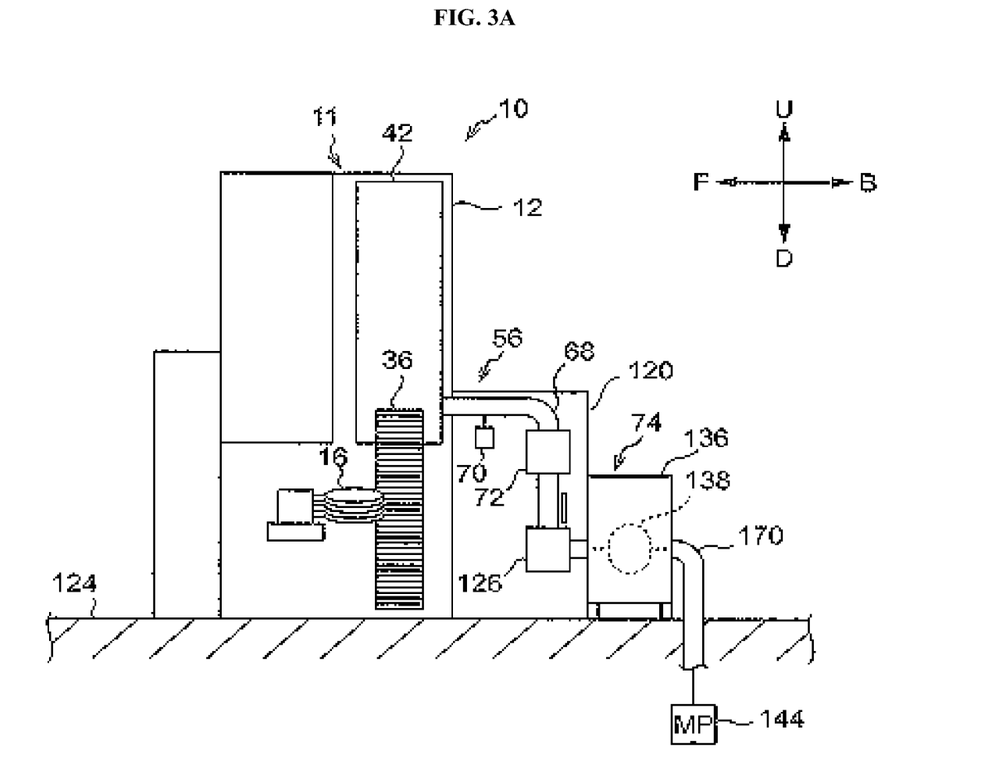
FIG. 3A is a side view schematically illustrating a part of an internal configuration of the processing apparatus according to the embodiment described herein

As shown in FIGS. 1B and 3A, the processing apparatus 10 is provided on a floor 124 (according to the present embodiment, for example, a third floor). The processing apparatus 10 includes a process structure 11 including each component constituting an internal configuration of a housing 12. An opening is provided at a front wall of the housing 12, which faces in the direction of the arrow F, in order to maintain the processing apparatus 10, and a pair of front maintenance doors 14 serving as an opener/closer (which is an opening/closing mechanism) configured to open or close the opening are provided at the opening. In the processing apparatus 10, a pod (which is a substrate container) 18 capable of accommodating a substrate (also referred to as a "wafer") 16 such as a silicon wafer serving as an object to be processed described later is used as a carrier to transfer the substrate 16 into or out of the housing 12. For example, the substrate 16 is used for a semiconductor device.

As shown in FIG. 1A, a pod loading/unloading port (not shown) is provided at the front wall of the housing 12 of the process structure 11 so as to communicate between an inside and an outside of the housing 12. The pod 18 may be transferred (loaded) into or transferred (unloaded) out of the housing 12 through a pod loading/unloading port. A loading port (which is a loading port shelf) 20 is provided at the pod loading/unloading port. The pod 18 may be placed on the loading port 20. The pod 18 is aligned while placed on the loading port 20.

A rotatable pod shelf 22 is provided over a substantially center portion of the housing 12. The rotatable pod shelf 22 may hold a plurality of pods (also simply referred to as "pods") including the pod 18. A plurality of pods (also simply referred to as "pods") including the pod 18 may be stored (or placed) on the rotatable pod shelf 22. The rotatable pod shelf 22 includes a vertical column capable of rotating horizontally and a plurality of shelf plates (also simply referred to as "shelf plates") radially supported by the vertical column at an upper end portion, a mid portion and a lower end portion of the vertical column. Each of the shelf plates is configured to support pods such as the pod 18 placed thereon.

A pod transport device 24 is provided between the loading port 20 and the rotatable pod shelf 22 in the housing 12. For example, the pod transport device 24 is constituted by: a pod elevator 24a capable of elevating and lowering while supporting the pod 18; and a pod transport mechanism 24b. The pod transport device 24 is configured to transport the pod 18 among the loading port 20, the rotatable pod shelf 22 and a pod opener 26 described later by consecutive operations of the pod elevator 24a and the pod transport mechanism 24b.

A sub-housing 28 is provided below the substantially center portion in a front-rear direction in the housing 12 toward a rear end of the processing apparatus 10. A pair of pod openers including the pod opener 26 is provided at a front wall of the sub-housing 28. The substrate 16 may be transferred (loaded) into or transferred (unloaded) out of the sub-housing 28 through the pair of the pod openers. For example, an upper pod opener and a lower pod opener may be provided as the pair of the pod openers. The upper pod opener and the lower pod opener may be collectively or individually referred to as the "pod opener 26". The upper pod opener may also be referred to as the upper pod opener 26, and the lower pod opener may also be referred to as the lower pod opener 26.

The pod opener 26 includes: a placement table (not shown) where the pod 18 is placed thereon; and a cap attaching/detaching mechanism 30 configured to attach or detach a cap of the pod 18. By detaching or attaching the cap of the pod 18 placed on the placement table by the cap attaching/detaching mechanism 30 of the pod opener 26, a wafer entrance of the pod 18 may be opened or closed.

The sub-housing 28 provided in the housing 12 defines a transfer chamber 32 fluidically isolated from a space in which components such as the pod transport device 24 and the rotatable pod shelf 22 are provided. A wafer transport mechanism (also referred to as a "substrate transport mechanism") 34 is provided in a front region of the transfer chamber 32. For example, the substrate transport mechanism 34 is constituted by a substrate transport device 34a and a substrate transport device elevator 34b. The substrate transport device 34a is configured to rotate or move the substrate 16 horizontally. The substrate transport device elevator 34b is configured to elevate or lower the substrate transport device 34a. The substrate transport device elevator 34b is installed between a right end of the front region of the transfer chamber 32 of the sub-housing 28 and a right end of the housing 12. The substrate transport device 34a may includes tweezers (not shown) serving as a holder of the substrate 16. The substrate transport mechanism 34 may load (charge) or unload (discharge) the substrate 16 into or out of a boat 36 serving as a substrate retainer by consecutive operations of the substrate transport device elevator 34b and the substrate transport device 34a.

Figure 2:
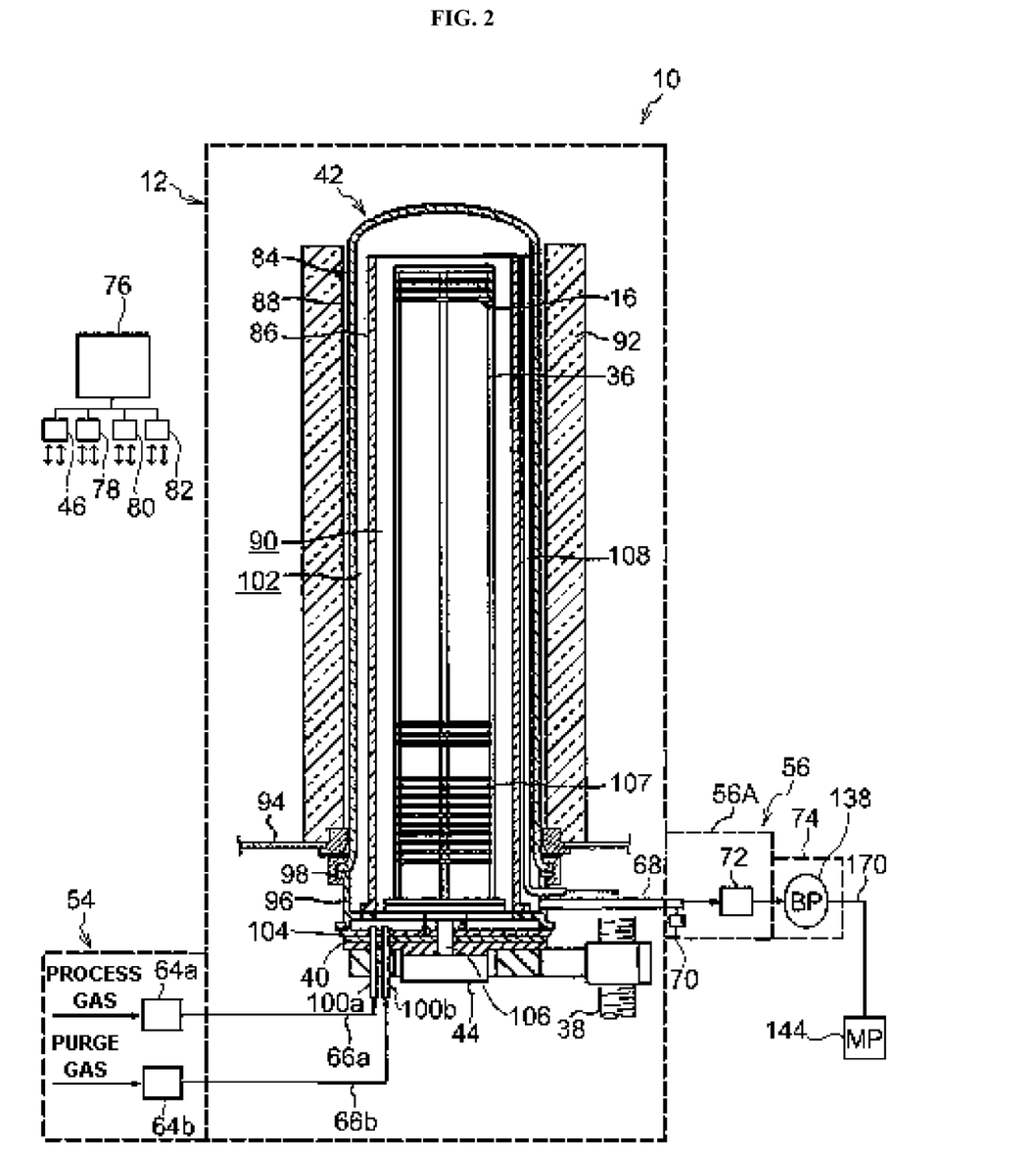
FIG. 2 is a cross-sectional view schematically illustrating a part of the processing apparatus according to the embodiment described herein

As shown in FIGS. 1B and 2, a boat elevator 38 capable of elevating or lowering the boat 36 is provided in the sub-housing 28 (that is, in the transfer chamber 32). An arm (not shown) is connected to an elevating table (not shown) of the boat elevator 38. A lid 40 is provided horizontally at the arm. The lid 40 is configured to support the boat 36 vertically and to close a lower end of a process furnace 42.

As shown in FIGS. 1B and 2, a transfer mechanism is constituted by the rotatable pod shelf 22, the boat elevator 38, the pod transport device 24, the substrate transport mechanism 34, the boat 36 and a rotator (which is a rotating mechanism) 44. The rotatable pod shelf 22, the boat elevator 38, the pod transport device 24, the substrate transport mechanism 34, the boat 36 and the rotator 44 are electrically connected to a transfer controller 46.

As shown in FIG. 1A, the process furnace 42 is provided above a standby space 48 where the boat 36 is accommodated and in standby.

A clean air supply structure (which is a clean air supply mechanism) 50 is provided at a left side end of the transfer chamber 32, wherein the left side end is located opposite to the substrate transport device elevator 34b. The clean air supply structure 50 is configured to supply clean air 52 such as an inert gas and clean atmosphere. The clean air 52 ejected from the clean air supply structure 50 flows around the substrate transport device 34a and the boat 36 accommodated in and the standby space 48. Thereafter, the clean air 52 is exhausted out of the housing 12 through a duct (not shown) or circulated back to a primary side (supply side) of the clean air supply structure 50, and then ejected again into the transfer chamber 32.

As shown in FIG. 1A, the process structure 11 includes components constituting the internal configuration of the housing 12 such as the process furnace 42, the rotatable pod shelf 22, the pod transport device 24, the substrate transport mechanism 34 and the boat 36. The process structure 11 also includes components constituting an internal configuration of the sub-housing 28. In addition, the process structure 11 may further include the pod 18 and the substrate 16.

As shown in FIG. 2, a process gas supply system and a purge gas supply system are stored in a gas supply structure (which is a gas supply system) 54. The process gas supply system includes a process gas supply source (not shown), an opening/closing valve (not shown), a mass flow controller (hereinafter, also referred to as an "MFC") 64a serving as a gas flow rate controller and a process gas supply pipe 66a. The purge gas supply system includes a purge gas supply source (not shown), an opening/closing valve (not shown), an MFC 64b and a purge gas supply pipe 66b.

An exhaust pipe 68, a pressure sensor 70 serving as a pressure detector and a gas exhaust mechanism constituted by a pressure regulator 72 such as an APC (Automatic Pressure Controller) valve are stored in a housing 56A of an exhaust structure 56. The exhaust structure 56 will be described later in detail.

As shown in FIG. 2, an exhaust apparatus 74 is provided adjacent to the exhaust structure 56. The exhaust apparatus 74 will be described later in detail.

As shown in FIG. 2, a substrate processing apparatus controller (hereinafter, also simply referred to as a "controller") 76 serving as a control device is connected to each of the transfer controller 46, a temperature controller 78, a pressure controller 80 and a gas supply controller 82.

(2) Configuration of Process Furnace

As shown in FIG. 2, the process furnace 42 includes a reaction tube 84. The reaction tube 84 includes an inner reaction tube 86 and an outer reaction tube 88 provided outside the inner reaction tube 86. The inner reaction tube 86 is of a cylindrical shape. A process chamber 90 in which the substrate 16 is processed is provided in a hollow portion of the inner reaction tube 86. The process chamber 90 is configured to accommodate the boat 36.

A heater 92 is provided outside the reaction tube 84 to surround a side wall of the reaction tube 84. The heater 92 is of a cylindrical shape. The heater 92 is vertically supported by a heater base 94.

A furnace opening 96 of a cylindrical shape is provided under the outer reaction tube 88. The outer reaction tube 88 and the furnace opening 96 are concentrically arranged. The furnace opening 96 is provided to vertically support a lower end of the inner reaction tube 86 and a lower end of the outer reaction tube 88. The furnace opening 96 engages with the lower end of the inner reaction tube 86 and the lower end of the outer reaction tube 88. An O-ring 98 serving as a seal is provided between the furnace opening 96 and the outer reaction tube 88. By supporting the furnace opening 96 on the heater base 94, the reaction tube 84 is vertically provided. A reaction vessel is constituted by the reaction tube 84 and the furnace opening 96.

A process gas nozzle 100a and a purge gas nozzle 100b are connected to the furnace opening 96 to communicate with the process chamber 90. The process gas supply pipe 66a is connected to the process gas nozzle 100a. Components such as the process gas supply source (not shown) are connected to an upstream side of the process gas supply pipe 66a through the MFC 64a. The purge gas supply pipe 66b is connected to the purge gas nozzle 100b. Components such as the purge gas supply source (not shown) are connected to an upstream side of the purge gas supply pipe 66b through the MFC 64b. The gas supply controller 82 is electrically connected to the MFCs 64a and 64b.

The exhaust pipe 68 configured to exhaust an inner atmosphere of the process chamber 90 is provided at the furnace opening 96. The exhaust pipe 68 is disposed at a lower end of an annular space 102 which is a gap between the inner reaction tube 86 and the outer reaction tube 88. The exhaust pipe 68 is spatially connected to the annular space 102.

The lid 40 capable of sealing the furnace opening 96 in an airtight manner is provided under the furnace opening 96. An O-ring 104, serving as a seal and being in contact with a lower end of the furnace opening 96, is provided on an upper surface of the lid 40.

The rotator 44 configured to rotate the boat 36 is provided about a center of the lid 40 opposite to the process chamber 90. A rotating shaft 106 of the rotator 44 is connected to the boat 36 through the lid 40 and supports the boat 36 from thereunder. As the rotator 44 rotates the boat 36, the substrate 16 is rotated.

The lid 40 may be elevated or lowered in the vertical direction by the boat elevator 38 installed outside the reaction tube 84. When the lid 40 is elevated or lowered by the boat elevator 38, the boat 36 may be loaded into the process chamber 90 or unloaded out of the process chamber 90. The transfer controller 46 is electrically connected to the rotator 44 and the boat elevator 38.

The boat 36 is configured to support a plurality of substrates including the substrate 16 in a horizontal orientation in a multistage manner. Insulating plates 107 serving as an insulator are provided under the boat 36. The insulating plates 107 are arranged in a horizontal orientation in a multistage manner. The insulating plates 107 are configured to suppress the transmission of the heat from the heater 92 to the furnace opening 96.

A temperature sensor 108 serving as a temperature detector is provided in the reaction tube 84. The temperature controller 78 is electrically connected to the heater 92 and the temperature sensor 108.

<Exhaust Structure>

As shown in FIG. 3A, the exhaust structure 56 includes a housing 120 whose longitudinal direction (a direction of the maximum dimension) is oriented in the vertical direction. For example, the housing 120 of a box shape is constituted by metal plates. A piping 122 with a gate valve attached thereon is connected in the middle of the exhaust pipe 68 on a downstream side of the exhaust pipe 68 in the housing 120.

Figure 4:
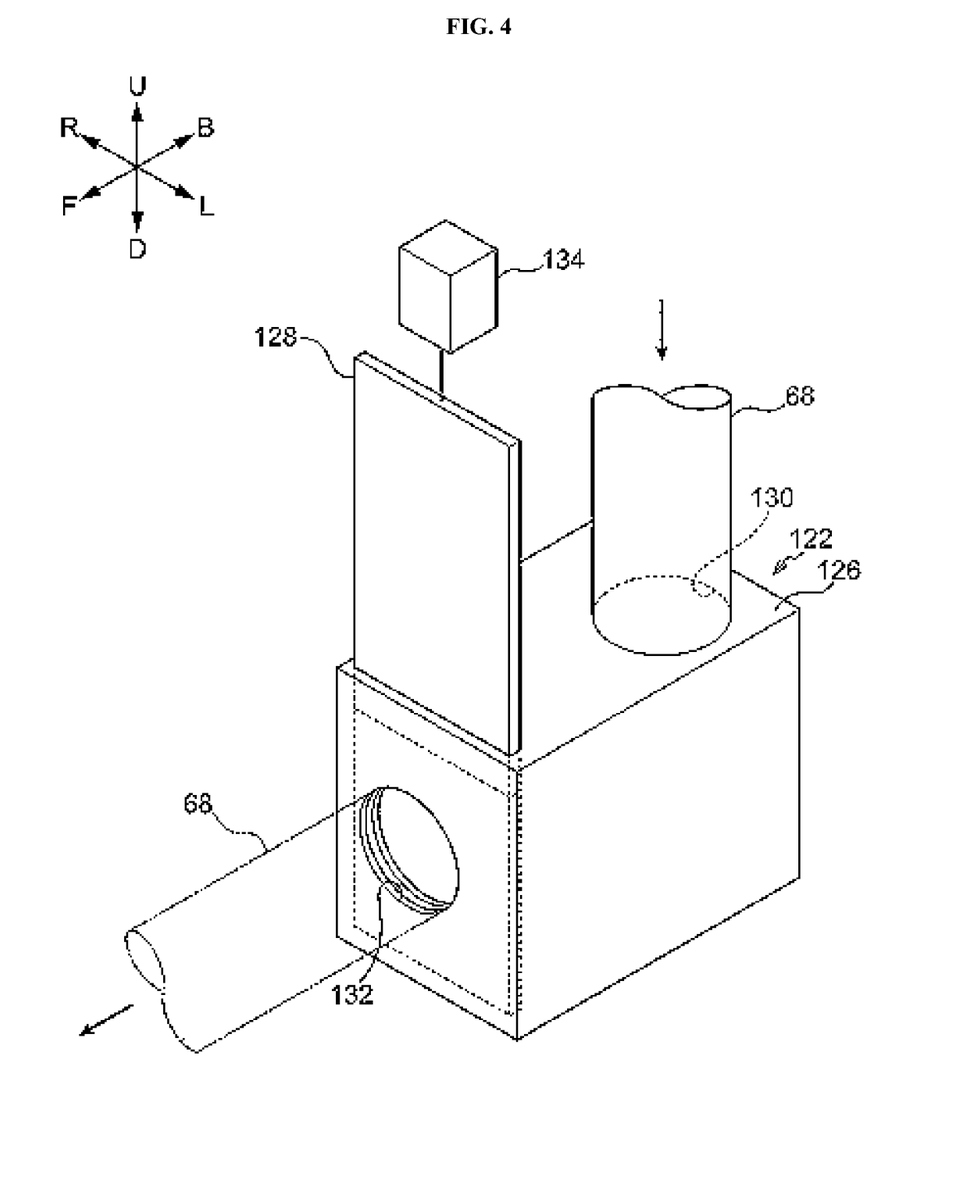
FIG. 4 is a perspective view schematically illustrating a gate valve used in an exhaust structure of the processing apparatus according to the embodiment described herein.

As shown in FIG. 4, the piping 122 is opened and closed by moving a valve body 128 at a right angle (vertically) with respect to a flow path. The valve body 128 serves as the gate valve of a plate shape accommodated in a box pipe (box structure) 126 serving as a block pipe. The box pipe 126 is of a rectangular box shape, and is provided with an inlet 130 at an upper portion thereof and an outlet 132 at a side portion thereof so as to absorb a positional deviation between a vertical portion of the exhaust pipe 68 extending (in the vertical direction) toward the inlet 130 and a horizontal portion of the exhaust pipe 68 extending (in the horizontal direction) from the outlet 132 toward the exhaust apparatus 74. In other words, a pipe axis of the inlet 130 and a pipe axis of the outlet 132 are offset in the horizontal direction without intersecting each other. As described above, according to the embodiment, the box pipe 126 connecting the vertical portion of the exhaust pipe 68 with the horizontal portion of the exhaust pipe 68 is of a box shape. Thus, even when there occurs some positional deviation, it is possible to correct the positional deviation by positions of the inlet 130 and the outlet 132. In addition, since the box pipe 126 is of a box shape, it is possible to provide the valve body 128 in the box pipe 126. It is possible to block a back diffusion from the exhaust apparatus 74 or from an outside air, and it is also possible to suppress an outflow of an exhaust gas by closing the valve body 128 regardless of the position of the outlet 132. For example, when an abnormality occurs, the valve body 128 provided adjacent to the outlet 132 slides in the vertical direction to open or close the outlet 132. By closing the valve body 128, it is possible to suppress the outflow of the exhaust gas. The valve body 128 may be manually slid or may be slid by an actuator 134. In addition, the valve body 128 may be omitted. The valve body 128 may be provided adjacent to the inlet 130, and may be opened or closed by moving horizontally with respect to the flow path. In addition, two valve bodies including the valve body 128 may be provided adjacent to the inlet 130 and the outlet 132, respectively.

As shown in FIG. 3A, in the housing 120 of the exhaust structure 56, the pressure sensor 70, the pressure regulator 72 and the box pipe 126 are sequentially connected to the exhaust pipe 68 from an upstream side of the exhaust pipe 68. With such a configuration, the housing 120 of the exhaust structure 56 and a housing 136 of the exhaust apparatus 74 are adjacent to each other as described later. The pressure controller 80 is electrically connected to the pressure regulator 72 and the pressure sensor 70.

<Exhaust Apparatus>

As shown in FIG. 3A, the exhaust apparatus 74 is configured to accommodate a booster pump 138 in the housing 136. For example, the housing 136 of a rectangular box shape is constituted by metal plates, and is fixed to the same floor 124 on which the exhaust structure 56 is provided by using a component such as an anchor (not shown).

Figure 3B:
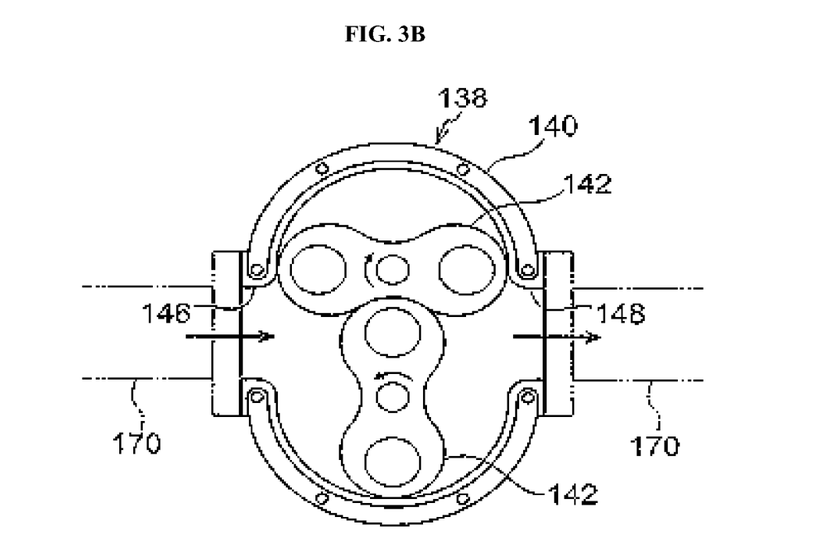
FIG. 3B is a cross-sectional view schematically illustrating a booster pump used in an exhaust apparatus of the processing apparatus according to the embodiment described herein.

As shown in FIG. 3B, the booster pump 138 according to the present embodiment is a pump with a function of increasing an exhaust speed. For example, the booster pump 138 is a mechanical pump in which two cocoon-shaped rotors 142 arranged at an angle of 90 degrees to each other in an oval casing 140 are rotated at a high speed. In combination with a main pump 144 such as a dry pump serving as a roughing vacuum pump described later, the booster pump 138 can significantly increase the exhaust speed in a pressure region where the exhaust speed of the main pump 144 decreases. The booster pump 138 is supported in the housing 136 via an anti-vibration device (not shown). Thereby, anti-vibration effect can be achieved for the exhaust apparatus 74 by suppressing a vibration of the booster pump 138 from being transmitted to the housing 136 and absorbing a vibration due to, e.g., an earthquake.

The booster pump 138 is provided in the housing 136 whose longitudinal direction (maximum dimension) is oriented in the vertical direction, that is, in a vertically elongated manner. The housing 136 is also provided in a vertically elongated manner according to an arrangement of the booster pump 138 so that an installation area of the housing 136 on the floor 124 is reduced.

In the booster pump 138 with its longitudinal direction (maximum dimension) is oriented in the vertical direction, an intake port 146 and an exhaust port 148 are oriented in the horizontal direction.

Figure 5:
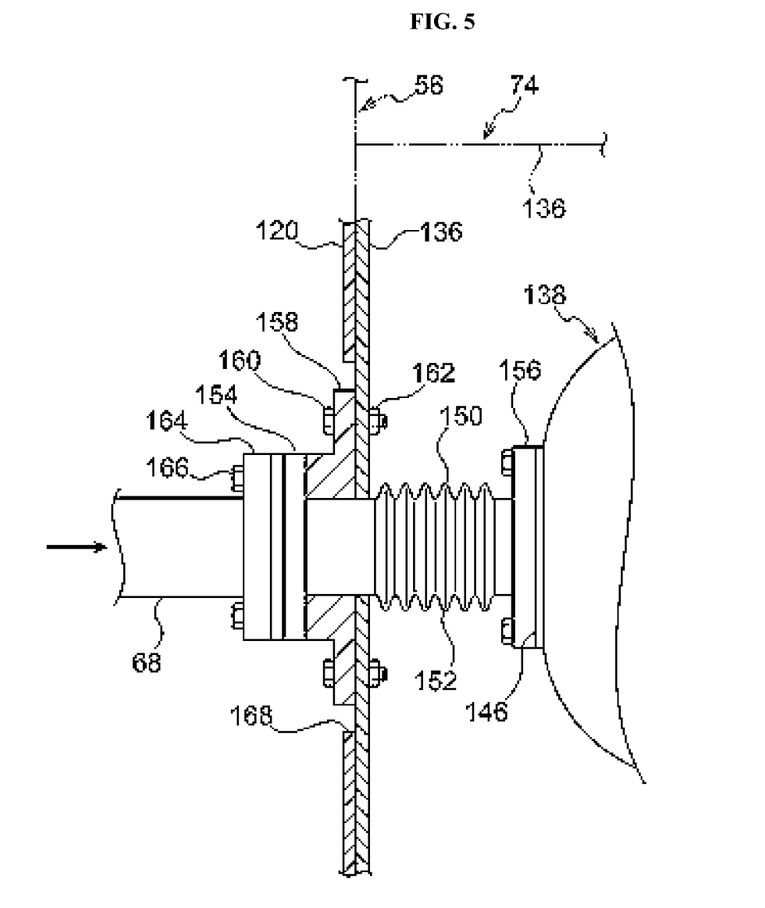
FIG. 5 is a cross-sectional view schematically illustrating a part of the exhaust apparatus and the exhaust structure of the processing apparatus according to the embodiment described herein.

As shown in FIG. 5, an end of the exhaust pipe 68 of the exhaust structure 56 is connected to the intake port 146 of the booster pump 138 via a vibration absorbing connector 150 of a tubular shape. A bellows 152 is formed at an intermediate portion of the vibration absorbing connector 150 so that it can be elastically deformed and can absorb the vibration transmitted from one side to the other in the longitudinal direction. Thus, the vibration absorbing connector 150 can absorb the vibration between the exhaust pipe 68 of the exhaust apparatus 74 and the intake port 146 of the booster pump 138 of the exhaust structure 56.

Flanges 154 and 156 are provided on both ends of the vibration absorbing connector 150, respectively. One side of the vibration absorbing connector 150 is fixed to a side wall of the housing 136 of the exhaust apparatus 74 via a mounting flange 158. The mounting flange 158 is fixed to the side wall of the housing 136 with a bolt 160 and a nut 162.

The flange 154 of the vibration absorbing connector 150 is fixed to the mounting flange 158 with a bolt 166 together with a flange 164 provided at the end of the exhaust pipe 68. A through-hole 168 is provided in a side wall of the housing 120 of the exhaust structure 56 so as to penetrate the vibration absorbing connector 150. A diameter of the through-hole 168 is greater than that of the mounting flange 158. Thus, as shown in FIGS. 4 and 5, the housing 120 of the exhaust structure 56 and the housing 136 of the exhaust apparatus 74 can be adjacent to each other. In addition, a gap may be provided between the housing 120 of the exhaust structure 56 and the housing 136 of the exhaust apparatus 74. According to the present embodiment, it is defined as "adjacent" even when there is some gap (within the size of, for example, the gap between adjacent housings 120).

As shown in FIG. 3B, an end of an exhaust pipe 170 is connected to the exhaust port 148 of the booster pump 138, and the exhaust gas discharged through the booster pump 138 is directed to the main pump 144 installed on a lower floor (for example, a first floor) through the exhaust pipe 170. The booster pump 138 and the main pump 144 are connected to a pump controller 171, and are controlled by the pump controller 171.

As described above, the processing apparatus 10 according to the present embodiment includes the process structure 11, the gas supply structure 54, the exhaust structure 56 and the exhaust apparatus 74. According to the present embodiment, the exhaust structure 56 and/or the gas supply structure 54 are not limited to the configuration provided outside of the housing 12 (provided as a separate body). For example, the exhaust structure 56 and/or the gas supply structure 54 may be provided in the housing 12 (that is, the housing 12 and the housing 120 may be integrated). Then, the exhaust apparatus 74 may be provided directly on the housing 12.

As shown in FIG. 1B, an opening 172 is provided on a back surface 12B of the housing 12 of the processing apparatus 10 in order to maintain the processing apparatus 10. The back surface 12B serves as a rear portion of the housing 12 oriented in the direction of the arrow B, and is provided at a center in a width direction of the housing 12. A maintenance door 174 configured to open or close the opening 172 is provided at the opening 172.

Figure 6:
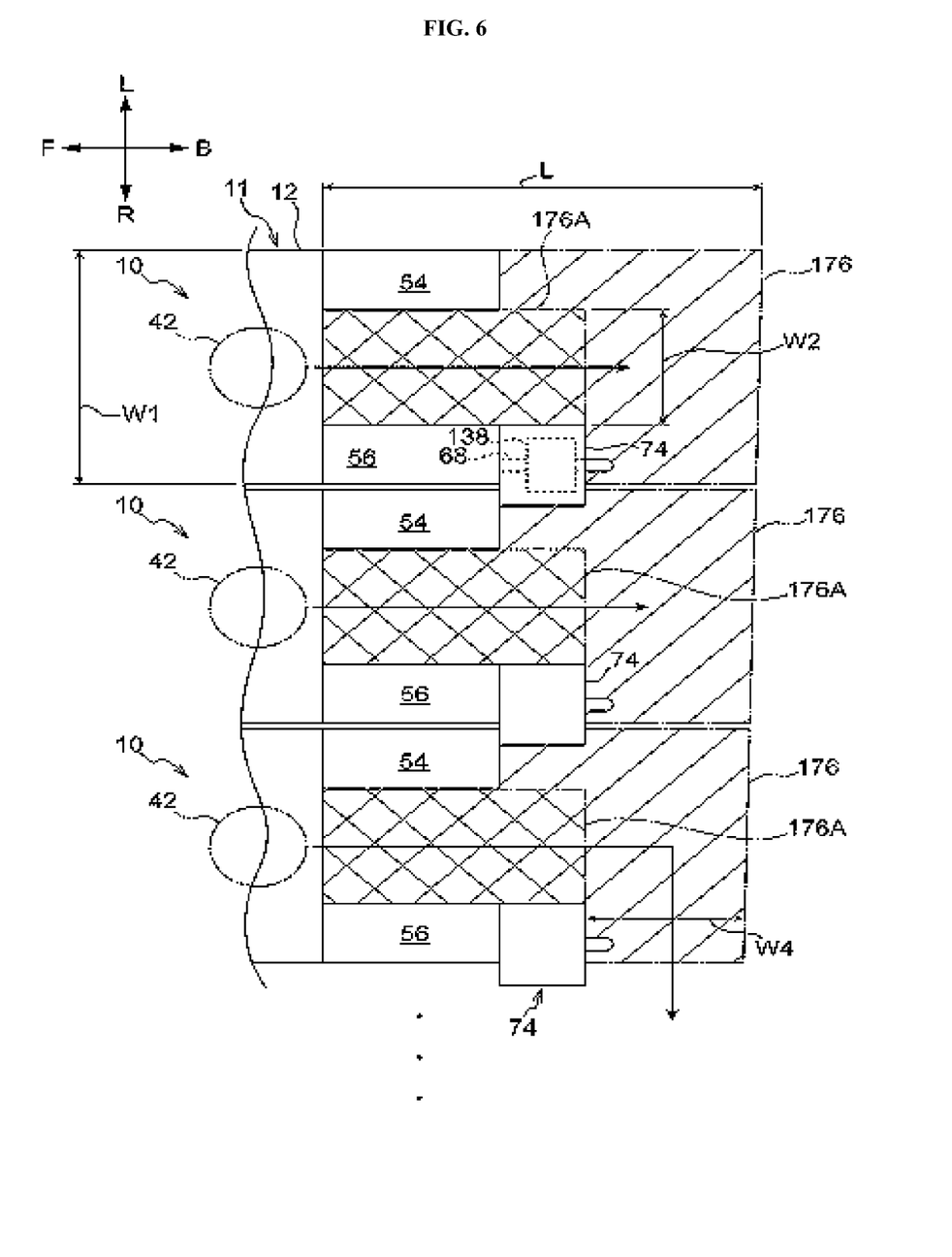
FIG. 6 is a plane view schematically illustrating a plurality of processing apparatuses according to the embodiment described herein.

As shown in FIGS. 1B and 6, the gas supply structure 54 is arranged adjacent to the housing 12 in the direction of the arrow B and adjacent to the opening 172 in the direction of the arrow L, and the exhaust structure 56 is arranged adjacent to the opening 172 in the direction of the arrow R. The exhaust apparatus 74 is arranged adjacent to the exhaust structure 56 in the direction of the arrow B.

FIG. 6 is a plane view schematically illustrating an arrangement in which a plurality of processing apparatuses 10 are arranged adjacent to one another in a width direction of each processing apparatus 10 (that is, in the direction of the arrow L or R). Each of a gap between two adjacent housings 120 is several cm or more (for example, 2 cm or more and 5 cm or less). As shown in FIG. 6, according to the present embodiment, a main maintenance region 176A is constituted by: a first region between the gas supply structure 54 and the exhaust structure 56; and a second region extending from a rear end (i.e., an end reached by moving in the direction of the arrow B) of the first region to a rear end (i.e., an end reached by moving in the direction of the arrow B) of the exhaust apparatus 74. The main maintenance region 176A is indicated by diagonal lines rising to the left. As shown in FIG. 1B and FIG. 6, a width W2 of the main maintenance region 176A of the present embodiment is set wider than a width W3 of the opening 172. According to the processing apparatus 10 of the present embodiment, a size (dimension) of the opening 172 is set such that the components of the processing apparatus 10 such as the process furnace 42, the reaction tube 84 and the boat 36 can be taken out of the processing apparatus 10 for maintenance. According to the present embodiment, the width W3 of the opening 172 is set wider than at least a width of the process furnace 42.

Each of a region indicated by diagonal lines rising to the right in FIG. 6 represents a maximum region of a maintenance region 176 that can be used by each of the processing apparatuses including the processing apparatus 10. A width W1 of the maintenance region 176 according to the present embodiment is the same width as a maximum width of the processing apparatus 10 (in the direction of the arrow L and in the direction of the arrow R). A length L (in the direction of the arrow F and in the direction of the arrow B) of the maintenance region 176 is not particularly predetermined, and may be determined in relation to other equipments installed on the floor. A width W4 of the maintenance region 176 to reach the exhaust apparatus 74 in the direction of the arrow F is determined such that the components of the processing apparatus 10 (for example, the reaction tube 84, the boat 36 and the process furnace 42) can be transported in the direction of the arrow L or R via a rear side space of the main maintenance region 176A located more in the direction of the arrow B. According to the present embodiment, since the exhaust structure 56 and the exhaust apparatus 74 are provided adjacent to each other, for example, the width W4 is set equal to or greater than the width W2. As described above, according to the present embodiment, it is possible to provide a space (for example, the maintenance region) in a region facing the opening 172, and it is possible to provide the space via which at least the components constituting the processing apparatus 10 such as the reaction tube 84 and the boat 36 can be transported. As a result, it is possible to perform a maintenance operation such as a replacement operation of the components constituting the processing apparatus 10 without delay, and thus it is possible to reduce a decrease in an apparatus operation rate.

According to the present embodiment, a center axis of the intake port 146 of the booster pump 138 and a center axis of the exhaust pipe 68 of the vibration absorbing connector 150 at a side of the exhaust structure 56 are connected to the exhaust structure 56 in a manner that both of them are offset with respect to a center axis of the exhaust structure 56 in the horizontal direction toward an outer side (i.e., in the direction of the arrow R). Thereby, for example, an inner side surface (i.e., a side surface facing in the direction of the arrow L) of the exhaust apparatus 74 does not protrude (extend) toward the main maintenance region 176A further than an inner side surface (i.e., a side surface facing in the direction of the arrow L) of the exhaust structure 56.

In addition, for example, the exhaust apparatus 74 is arranged such that the exhaust apparatus 74 of the processing apparatus 10 does not protrude (extend) toward a main maintenance region 176A of an adjacent processing apparatus 10 in the direction of the arrow R further than an inner side surface (i.e., a side surface facing in the direction of the arrow R) of a gas supply structure 54 of the adjacent processing apparatus 10.

(3) Operation of Substrate Processing Apparatus

Hereinafter, operations of the components constituting the processing apparatus 10 will be described with reference to FIGS. 1A, 1B and 2. The controller 76 is configured to control the operations of the components constituting the processing apparatus 10.

When the pod 18 is placed on the loading port 20 by an in-step transfer apparatus (not shown), the pod 18 is detected by a substrate detecting sensor 178 and the pod loading/unloading port (not shown) is opened by a front shutter (not shown). Then, the pod 18 placed on the loading port 20 is transferred (loaded) into the housing 12 through the pod loading/unloading port by the pod transport device 24.

The pod 18 loaded into the housing 12 is automatically transferred to and temporarily stored in a shelf plate of the rotatable pod shelf 22 by the pod transport device 24. Thereafter, the pod 18 is transferred to the placement table of one of the upper pod opener 26 and the lower pod opener 26 from the shelf plate of the rotatable pod shelf 22.

By detaching the cap of the pod 18 on the placement table by the cap attaching/detaching mechanism 30, the wafer entrance of the pod 18 is opened. Thereafter, the substrate 16 is transported out of the pod 18 by the tweezers of the substrate transport device 34a via the wafer entrance, and loaded into the standby space 48 provided at a rear portion of the transfer chamber 32. The substrate 16 is then charged (transferred) into the boat 36. After charging the substrate 16 into the boat 36, the substrate transport device 34a then returns to the pod 18 and transports a next substrate among the plurality of the substrates from the pod 18 into the boat 36.

While the substrate transport mechanism 34 loads the plurality of the substrates including the substrate 16 from the one of the upper pod opener 26 and the lower pod opener 26 into the boat 36, another pod 18 is transferred to and placed on the placement table of the other one of the upper pod opener 26 and the lower pod opener 26 from the rotatable pod shelf 22 by the pod transport device 24, and the cap of the another pod 18 is opened by the other one of the upper pod opener 26 and the lower pod opener 26.

After a predetermined number of the substrates including the substrate 16 are charged into the boat 36, the lower end of the process furnace 42 is opened by a furnace opening shutter (not shown). Subsequently, the boat 36 charged with a predetermined number of the substrates including the substrate 16 is loaded into the process furnace 42 by elevating the lid 40 by the boat elevator 38.

After the boat 36 accommodating the predetermined number of the substrates including the substrate 16 is loaded into the process chamber 90, the lid 40 seals the lower end of the furnace opening 96 via the O-ring 104.

The process chamber 90 is vacuum-exhausted by the booster pump 138 and the main pump 144 such that an inner pressure of the process chamber 90 is at a desired pressure (vacuum degree). While the process chamber 90 is vacuum-exhausted, the pressure regulator 72 is feedback-controlled based on the pressure measured by the pressure sensor 70. That is, the opening degree of the APC valve of the pressure regulator 72 is feedback-controlled. The heater 92 heats the process chamber 90 such that an inner temperature of the process chamber 90 is at a desired temperature. The energization state of the heater 92 is feedback-controlled based on the temperature detected by the temperature sensor 108. Thereafter, the boat 36 with the substrate 16 charged therein is rotated by the rotator 44.

Subsequently, a process gas is supplied from the process gas supply source (not shown). The process gas whose flow rate is adjusted by the MFC 64a is supplied into the process chamber 90 through the process gas supply pipe 66a. The process gas supplied into the process chamber 90 rises in the process chamber 90 and flows into the annular space 102 through the opening at an upper end of the inner reaction tube 86 and is exhausted through the exhaust pipe 68. The process gas contacts a surface of the substrate 16 as it passes through the process chamber 90, whereby a film is deposited on the surface of the substrate 16 by the thermal reaction.

After a predetermined process time has elapsed, a purge gas is supplied from the purge gas supply source (not shown). The purge gas whose flow rate is adjusted by the MFC 64b is supplied into the process chamber 90. The inner atmosphere of the process chamber 90 is replaced with the inert gas, and the inner pressure of the process chamber 90 is returned to a normal pressure.

Thereafter, the lower end of the furnace opening 96 is opened by lowering the lid 40 by the boat elevator 38. Processed substrates including the substrate 16 are transported out of the reaction tube 84 through the lower end of the furnace opening 96 while being supported by the boat 36 (boat unloading). The processed substrates including the substrate 16 are then discharged from the boat 36 and stored in the pod 18 (substrate discharging).

After the processed substrates are discharged, the pod 18 accommodating the processed substrates including the substrate 16 is unloaded from the housing 12 in an order substantially opposite to that described above except for an aligning process of the substrate 16 by the notch alignment device (not shown).

(4) Configuration of the Controller

Figure 7:
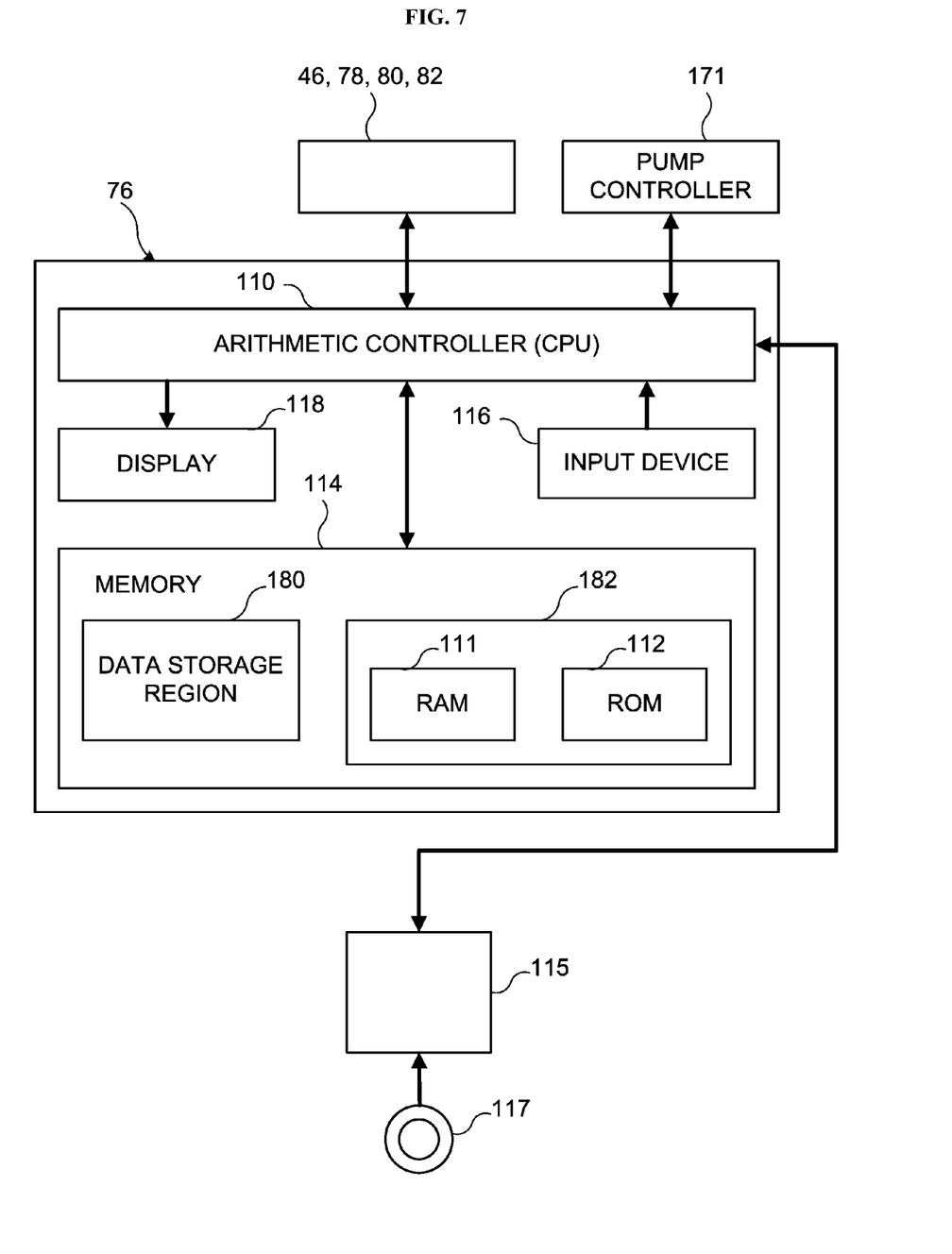
FIG. 7 is a block diagram schematically illustrating a substrate processing apparatus controller included in the processing apparatus according to the embodiment described herein.

The controller 76 serving as an operation device will be described with reference to FIG. 7.

The controller 76 is constituted mainly by: an arithmetic controller 110 such as a CPU (Central Processing Unit); a memory 114 such as a RAM 111, a ROM 112 and a hard disk drive (HDD) (not shown); an input device 116 such as mouse and keyboard; and a display 118 such as a monitor. In addition, data can be set by each of the arithmetic controller 110, the memory 114, the input device 116 and the display 118.

The arithmetic controller 110 constitutes a backbone of the controller 76. The arithmetic controller 110 is configured to execute a control program stored in the ROM 112 and a recipe (for example, a process recipe serving as a substrate processing recipe) stored in the memory 114 functioning as a recipe memory in accordance with an instruction from the display 118. Data such as an operating program of the arithmetic controller 110 configured to control the operations of components such as the booster pump 138 and the main pump 144 may be stored in the ROM 112. The memory (RAM) functions as a work area (that is, a temporary memory) of the arithmetic controller 110.

An optical drive 115 is connected to the arithmetic controller 110. For example, the optical drive 115 is configured to read information such as a program recorded in a CD-ROM 117 serving as a recording medium, and to record the information such as the read program in the ROM 112. Alternatively, a component such as a USB port may be connected to the arithmetic controller 110 to read information such as a program from the USB memory.

In the present specification, the term "substrate processing recipe" refers to a recipe in which information such as processing conditions and processing sequences of processing the substrate 16 is stored. Information such as a pre-set value (control value) or a transmission timing to be transmitted to components such as the transfer controller 46, the temperature controller 78, the pressure controller 80 and the gas supply controller 82 may be stored in the recipe for each step of a substrate processing described later.

The arithmetic controller 110 is configured to control parameters such as the inner temperature and the inner pressure of the process chamber 90 and the flow rate of the process gas supplied into the process chamber 90 in order to perform a predetermined process to the substrate 16 loaded in the process chamber 90.

The transfer controller 46 is configured to control the operation of the transfer mechanism configured to transport the substrate 16 such as the rotatable pod shelf 22, the boat elevator 38, the pod transport device 24, the substrate transport mechanism 34, the boat 36 and the rotator 44. Each of the rotatable pod shelf 22, the boat elevator 38, the pod transport device 24, the substrate transport mechanism 34, the boat 36 and the rotator 44 includes a sensor (not shown). The transfer controller 46 is configured to notify the controller 76 of the values detected by the sensors when a predetermined value and an abnormal value are detected by the sensors.

The memory 114 includes a data storage region 180 where various data are stored and a program storage region 182 where various programs such as the substrate processing recipe are stored.

Various parameters related to the recipe are stored in the data storage region 180. The various programs such as the substrate processing recipe used for controlling the operation of the processing apparatus 10 are stored in the program storage region 182.

A touch panel (not shown) is provided in the display 118 of the controller 76. The touch panel is configured to receive an operation command for operating a substrate transfer system and a substrate processing system when a screen is displayed. The controller 76 preferably includes at least the display 118 and the input device 116 as an operating terminal (terminal device) such as a computer and a mobile terminal device.

The temperature controller 78 is configured to adjust an inner temperature of the process furnace 42 by controlling a temperature of the heater 92 of the process furnace 42. The temperature controller 78 is also configured to notify the controller 76 of the values detected by the temperature sensor 108 when a predetermined value and an abnormal value are detected by the temperature sensor 108.

The pressure controller 80 is configured to control the pressure regulator 72 based on the pressure detected by the pressure sensor 70 such that the inner pressure of the process chamber 90 is at a desired pressure at a desired timing. The pressure controller 80 is also configured to notify the controller 76 of the values detected by the pressure sensor 70 when a predetermined value and an abnormal value are detected by the pressure sensor 70.

The gas supply controller 82 is configured to control the MFC 64a such that the flow rate of gas supplied into the process chamber 90 is at a desired flow rate at a desired timing. The gas supply controller 82 is also configured to notify the controller 76 of the values detected by a sensor (not shown) provided at components such as the MFC 64a when a predetermined value and an abnormal value are detected by the sensor.

<Operation and Effect of Substrate Processing Apparatus>

Substrate Processing According to Present Embodiment

Subsequently, the substrate processing of processing the substrate 16 using the processing apparatus 10 serving as a semiconductor manufacturing apparatus will be described. The substrate processing is a part of manufacturing processes of the semiconductor device such as an IC and an LSI.

In the description below, the controller 76 controls the processes and the operations of the components constituting the processing apparatus 10. Hereinafter, the substrate processing will be described with reference to FIG. 8.

In the present embodiment, the substrate processing will be described by way of an example in which a silicon nitride film (SiN film) is formed on the substrate 16 using hexachlorodisilane ($Si_2Cl_6$, abbreviated as HCDS) gas as a source gas and $NH_3$ (ammonia) as a reactive gas.

<Substrate Loading Step S102>

Figure 8:
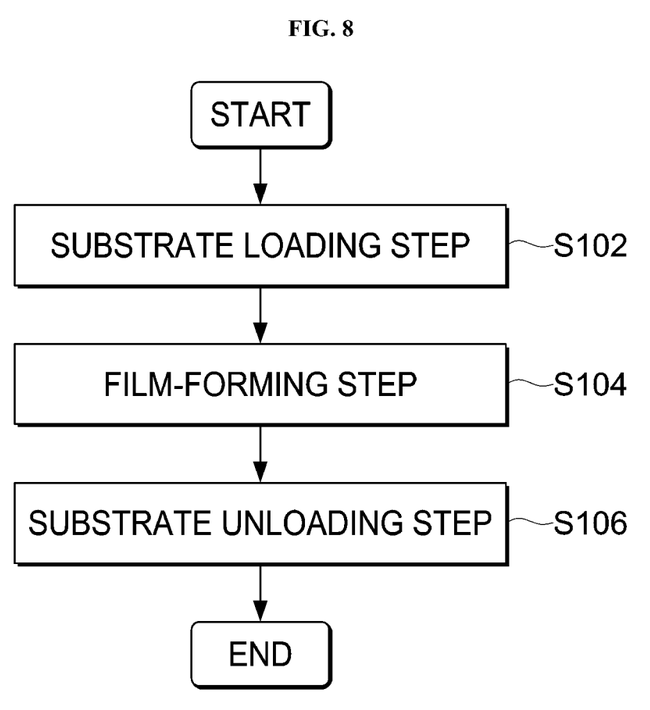
FIG. 8 is a flowchart schematically illustrating a film-forming sequence performed by the processing apparatus according to the embodiment described herein.

In the substrate loading step S102, the boat 36 is charged with the substrate 16, and the boat 36 charged with the substrate 16 is then loaded into the process chamber 90.

<Film-Forming Step S104>

In the film-forming step S104, four steps described below, namely, first through fourth steps, are sequentially performed. While performing the first through the fourth steps, the substrate 16 is heated to a predetermined temperature by the heater 92.

<First Step>

In the first step, the HCDS gas is supplied into the process chamber 90 by opening the opening/closing valve (not shown) provided at the process gas supply pipe 66a and the pressure regulator 72 (that is, the APC valve) provided at the exhaust pipe 68, and is exhausted through the exhaust pipe 68. Thereby, a silicon film is formed on the surface of the substrate 16.

<Second Step>

In the second step, the opening/closing valve provided at the process gas supply pipe 66a is closed to stop the supply of the HCDS gas. With the pressure regulator 72 (that is, the APC valve) provided at the exhaust pipe 68 open, the process chamber 90 is vacuum-exhausted by the booster pump 138 and the main pump 144 to remove the gas remaining in the process chamber 90 from the process chamber 90. In addition, the inert gas such as $N_2$ gas is supplied into the process chamber 90 to purge the process chamber 90, and the gas remaining in the process chamber 90 is discharged (removed) from the process chamber 90 to the outside of the process chamber 90. In the second step, the inert gas such as the $N_2$ gas whose flow rate is adjusted by the MFC 64b may be supplied into the process chamber 90 by opening the opening/closing valve provided at the purge gas supply pipe 66b of the purge gas supply system.

<Third Step>

In the third step, the $NH_3$ gas is supplied into the process chamber 90, and is exhausted through the exhaust pipe 68. By the reaction between the silicon film on the surface of the substrate 16 formed by the HCDS gas supplied in the first step and the $NH_3$ gas supplied in the third step, the silicon nitride (SiN) film is formed on the surface of the substrate 16.

<Fourth Step>

In the fourth step, the supply of the $NH_3$ gas is stopped. With the pressure regulator 72 (that is, the APC valve) provided at the exhaust pipe 68 open, the process chamber 90 is vacuum-exhausted by the booster pump 138 and the main pump 144 to remove the gas remaining in the process chamber 90 from the process chamber 90. In addition, the inert gas such as $N_2$ gas is supplied into the process chamber 90 to purge the process chamber 90.

The SiN film of a desired thickness is formed on the substrate 16 by performing a cycle including the first step through the fourth step a plurality of times.

<Substrate Unloading Step S106>

In the substrate unloading step S106, the boat 36 accommodating the substrate 16 with the SiN film formed thereon is unloaded from the process chamber 90.

Figure 9:
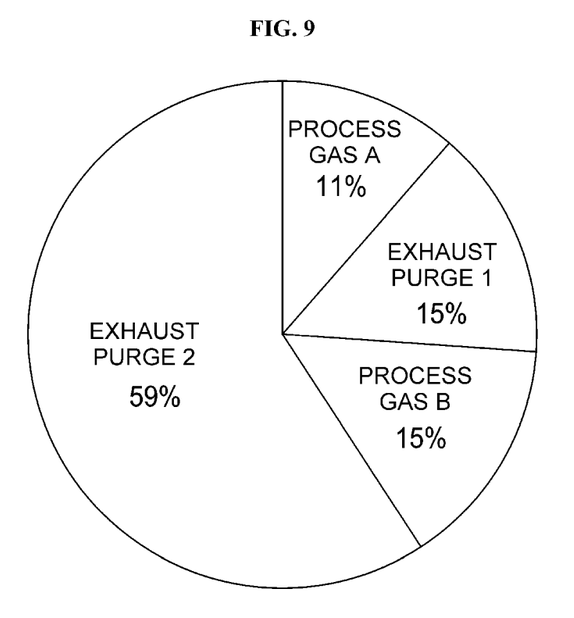
FIG. 9 is a diagram schematically illustrating a graph for understanding an operation of a configuration of an exhaust system included in the processing apparatus according to the embodiment described herein.

FIG. 9 illustrates an example of the process recipe of a conventional substrate processing apparatus performed by the substrate processing shown in FIG. 8, in particular, illustrates a ratio occupied by each processing step. In the conventional substrate processing apparatus, for example, the exhaust structure 56 and the exhaust apparatus 74 are installed on the third floor, and the booster pump 138 and the main pump 144 are installed on the first floor. In FIG. 9, the source gas is indicated by "PROCESS GAS A", and the reactive gas is indicated by "PROCESS GAS B". In the conventional substrate processing apparatus, a ratio of an exhaust process (processes indicated by "EXHAUST PURGE 1" and "EXHAUST PURGE 2") in the entire process of the process recipe reaches 74%.

However, according to the present embodiment, since the booster pump 138 is provided in the vicinity of the process furnace 42 on the same floor 124, it is possible to improve an exhaust capacity and to shorten a time of performing the exhaust process as compared with a case where the booster pump 138 and the main pump 144 are provided on a floor different from the floor on which the process furnace 42 is provided. Thereby, it is possible to improve the throughput of the substrate processing.

According to the processing apparatus 10 of the present embodiment, as shown in FIGS. 1B and 6, the maintenance region 176 whose width is wider than that of the opening 172 is provided in a rear portion of the housing 12 (i.e., in a portion located more in the direction of the arrow B) to face the opening 172, and the exhaust apparatus 74 is located more backward than the processing apparatus 10 so as to allow the maintenance region 176 to be provided to face the opening 172. Thereby, it is possible to take the components of the processing apparatus 10 such as the process furnace 42, the reaction tube 84 and the boat 36 out of the processing apparatus 10 through the maintenance region 176 and the opening 172 to easily perform the maintenance operation. That is, according to the present embodiment, as long as a space within the maintenance region 176 where the maintenance operation is possible is secured, the main maintenance region 176A may be omitted.

For example, according to the processing apparatus 10 of the present embodiment, as shown in FIGS. 1B and 6, the main maintenance region 176A whose width is wider than that of the opening 172 is provided in a rear portion of the housing 12 (i.e., in a portion located more in the direction of the arrow B) to face the opening 172. The exhaust apparatus 74 is located more backward than the processing apparatus 10 so as not to protrude into the main maintenance region 176A. The exhaust apparatus 74 of the processing apparatus 10 is arranged not to protrude toward a main maintenance region 176A of an adjacent processing apparatus 10 in the direction of the arrow R further than the inner side surface of the gas supply structure 54 of the adjacent processing apparatus 10. Thereby, even when the plurality of the processing apparatuses 10 are provided adjacent to one another along the width direction of each processing apparatus 10 (that is, along the direction of the arrow L or R), it is possible to provide the main maintenance region 176A which enables the maintenance operation of the processing apparatus 10 at the front surface side of the opening 172. Further, for example, it is possible to take the components of the processing apparatus 10 such as the process furnace 42, the reaction tube 84 and the boat 36 out of the processing apparatus 10 via the maintenance region 176 (more particularly, the main maintenance region 176A) and the opening 172, thereby easily performing the maintenance operation. In addition, as long as a sufficient space (for example, the maintenance region 176 of sufficient size) is secured, it is possible to allow the exhaust apparatus 74 to protrude into the main maintenance region 176A.

According to the present embodiment, since the exhaust structure 56 and the exhaust apparatus 74 are provided adjacent to each other, the width W4 of the maintenance region 176 and the exhaust apparatus 74 defined in the direction of the arrow B is set equal to or greater than the width W2 such that the components of the processing apparatus 10 (for example, the reaction tube 84, the boat 36 and the process furnace 42) can be transported in the direction of the arrow L or R. That is, it is possible to transport replacement components (for example, the reaction tube 84 and the boat 36) of the processing apparatus 10 via the opening 172 and the maintenance region 176 (more particularly, the main maintenance region 176A).

According to the processing apparatus 10 of the present embodiment, the booster pump 138 vibrates by driving the booster pump 138. However, since the booster pump 138 is supported by the housing 136 via the anti-vibration device, it is possible to suppress the vibration of the booster pump 138 from being transmitted to the housing 136.

Since the exhaust pipe 68 of the exhaust structure 56 is connected to the booster pump 138 via the vibration absorbing connector 150, and an end of the vibration absorbing connector 150 adjacent to the exhaust pipe 68 is fixed in the housing 136 of the exhaust apparatus 74, it is possible to suppress the vibration of the booster pump 138 from being transmitted to the housing 136, and it is also possible to place the housing 120 of the exhaust structure 56 adjacent to the housing 136 of the exhaust apparatus 74. Therefore, it is possible to secure the maintenance region 176 in a rear portion of the exhaust apparatus 74.

It is preferable that the length of the vibration absorbing connector 150 and the number of bent locations therein are minimized as possible in consideration of the exhaust efficiency (exhaust conductance).

According to the processing apparatus 10 of the present embodiment, since the booster pump 138 is installed vertically (that is, installed with its longitudinal direction oriented in the vertical direction), the footprint of the exhaust apparatus 74 can be made smaller as compared with a case when the booster pump 138 is installed horizontally. Thereby, it is possible to reduce the installation area of the processing apparatus 10. As a result, it is possible to install as many processing apparatuses including the processing 10 as possible on a single floor, and it is possible to improve the processing efficiency (that is, the production efficiency) of the substrates 16.

When performing the maintenance operation on the booster pump 138, by removing the vibration absorbing connector 150, it is possible to easily replace the booster pump 138 by taking the booster pump 138 out of the processing apparatus 10.

Further, the gate valve attached to the piping 122 may be configured to close the flow path when the maintenance operation is performed or when an abnormal stop occurs. As a result, it is possible to prevent the particles generated by the back diffusion from the booster pump 138 to the process furnace 42.

According to the present embodiment, the gate valve attached to the piping 122 and the booster pump 138 are connected by using the exhaust pipe 68 and the vibration absorbing connector 150. However, it is also possible that the gate valve attached to the piping 122 and the booster pump 138 may be connected by only the vibration absorbing connector 150.

OTHER EMBODIMENTS

While the technique is described in detail by way of the above-described embodiment, the above-described technique is not limited thereto. The above-described technique may be modified in various ways without departing from the gist thereof.

While the above-described embodiment described by way of an example in which the film is deposited on the substrate 16, the above-described technique is not limited thereto. The above-described technique may be preferably applied to processes such as an oxidation process, a diffusion process, an annealing process and an etching process of the film formed on the substrate 16.

While the above-described embodiment is described by way of an example in which a batch type processing apparatus configured to simultaneously process the plurality of the substrates including the substrate 16 is used to form the film, the above-described technique is not limited thereto. In addition, while a processing apparatus provided with a hot wall type process furnace is exemplified in the above-described embodiment, the above-described technique is not limited thereto. For example, the above-described technique may also be preferably applied to form the film using a processing apparatus provided with a cold wall type process furnace.

The above-described technique is not limited to the semiconductor manufacturing apparatus such as the processing apparatus 10 according to the embodiment configured to process the substrate 16. The above-described technique may also be applied to an apparatus such as an LCD (Liquid Crystal Display) manufacturing apparatus configured to process a glass substrate.

In the above-described embodiment, a right side end (i. e, an end of a side facing in the direction of the arrow R) of the exhaust apparatus 74 protrudes from a right side end (i. e, an end of a side facing in the direction of the arrow R) of the exhaust structure 56 toward the direction of the arrow R. However, by using the booster pump 138 of a small type, it is also possible for the right side end of the exhaust apparatus 74 not to protrude from the right side end of the exhaust structure 56 toward the direction of the arrow R.

The entire contents of Japanese Patent Application No. 2018-040194, filed on Mar. 6, 2018, are hereby incorporated in the present specification by reference. All documents, patent applications, and technical standards described herein are hereby incorporated in the present specification by reference to the same extent that the contents of each of the documents, the patent applications and the technical standards are specifically described.

According to some embodiments in the present disclosure, since the maintenance region can be provided even when the exhaust apparatus is installed on the same floor as the floor on which the process furnace is installed, it is possible to perform the maintenance operation of the processing apparatus.

What is claimed is:
1. A processing apparatus comprising:
a process structure comprising:
a process chamber, in which an object to be processed is processed by gas, provided in a first housing; and an opening provided at a rear side of the first housing;

an exhaust structure configured to exhaust the gas from the process chamber; and an exhaust apparatus comprising:

a pump located on a same floor as the exhaust structure and provided with an intake port through which the gas is sucked, wherein the intake port is provided along a direction in which the gas is exhausted from the process chamber and faces toward a horizontal direction, and a length of the pump is maximum along a vertical direction; and a second housing vertically elongated in accordance with the pump.

2. The processing apparatus of claim 1, wherein the exhaust structure and the exhaust apparatus are box-shaped.

3. The processing apparatus of claim 1, wherein the exhaust structure is configured to be positioned at a location not facing the opening.

4. The processing apparatus of claim 1, wherein the exhaust apparatus is arranged adjacent to the exhaust structure.

5. The processing apparatus of claim 1, wherein the exhaust structure is configured to allow a main maintenance region to be provided at a region facing the opening, and a rear maintenance region provided behind the exhaust apparatus, and wherein a width of the main maintenance region or the rear maintenance region is sufficient for transporting apparatus components.

6. The processing apparatus of claim 5, further comprising a reaction tube constituting the process chamber, or a boat configured to hold the object to be processed, or both.

7. The processing apparatus of claim 1, wherein the exhaust structure is configured to be allow a main maintenance region to be provided at a region facing the opening, each of the exhaust structure and the exhaust apparatus comprises a first side facing the main maintenance region and a second side opposite to the first side, and the first side of the exhaust apparatus is positioned at a same location as the first side of the exhaust structure with respect to the main maintenance region, or positioned away from the main maintenance region farther than the first side of the exhaust structure.

8. The processing apparatus of claim 1, wherein the exhaust structure is configured to allow a main maintenance region to be provided at a region facing the opening, and the exhaust apparatus faces a maintenance region comprising the main maintenance region facing the opening in an apparatus width direction, and the maintenance region is further provided with a rear maintenance region at a rear side of the exhaust apparatus wherein a width of the rear maintenance region is equal to or greater than that of the main maintenance region.

* * * * *